(12) United States Patent
Dwilinski et al.

(10) Patent No.: US 7,057,211 B2
(45) Date of Patent: Jun. 6, 2006

(54) NITRIDE SEMICONDUCTOR LASER DEVICE AND MANUFACTURING METHOD THEREOF

(75) Inventors: Robert Dwilinski, Warsaw (PL);
Roman Doradzinski, Warsaw (PL);
Jerzy Garczynski, Lomianki (PL);
Leszek Sierzputowski, Union City, NJ (US); Yasuo Kanbara, Anan (JP)

(73) Assignees: Ammono SP. ZO.O, Warsaw (PL);
Nichia Corporation, Tokushima (JP)

( * ) Notice: Subject to any disclaimer, the term of this patent is extended or adjusted under 35 U.S.C. 154(b) by 0 days.

(21) Appl. No.: 10/493,746

(22) PCT Filed: Oct. 28, 2002

(86) PCT No.: PCT/JP02/11136

§ 371 (c)(1),
(2), (4) Date: Apr. 26, 2004

(87) PCT Pub. No.: WO03/036771

PCT Pub. Date: May 1, 2003

(65) Prior Publication Data

US 2004/0238810 A1 Dec. 2, 2004

(30) Foreign Application Priority Data

Oct. 26, 2001 (PL) .................................... 350375
Jun. 26, 2002 (PL) .................................... 354739

(51) Int. Cl.
*H01L 21/00* (2006.01)
(52) U.S. Cl. .......................... 257/97; 257/99; 257/103
(58) Field of Classification Search ................. 257/97, 257/99, 103, 94, 96, 79, 101, 102
See application file for complete search history.

(56) References Cited

U.S. PATENT DOCUMENTS

| 5,156,581 A | 10/1992 | Chow |
| 5,456,204 A | 10/1995 | Dimitrov et al. |
| 5,780,876 A | 7/1998 | Hata |
| 5,868,837 A | 2/1999 | DiSalvo et al. |
| 5,928,421 A | 7/1999 | Yuri et al. |
| 6,067,310 A | 5/2000 | Hashimoto et al. |
| 6,156,581 A | 12/2000 | Vaudo et al. |
| 6,172,382 B1 * | 1/2001 | Nagahama et al. ........... 257/94 |

(Continued)

FOREIGN PATENT DOCUMENTS

EP     0 711 853 B1    5/1996

(Continued)

OTHER PUBLICATIONS

R. Dwilinski et al., AMMONO method of GaN and AlN production, May 18, 1998, pp. 1348-1350.

(Continued)

*Primary Examiner*—Laura M. Schillinger
(74) *Attorney, Agent, or Firm*—Morrison & Foerster LLP (57) ABSTRACT

The object of this invention is to provide a high-output type nitride semiconductor laser device comprising a pair of end faces of a resonator.

The nitride semiconductor laser device comprises an n-type nitride semiconductor layer or layers, a p-type nitride semiconductor layer or layers and a resonator, provided with an active layer comprising nitride semiconductor containing In therebetween, wherein at least light emitting end face of the resonator is covered with an end face film of single crystal $Al_xGa_{1-x}N$ ($0 \leq x \leq 1$) formed at a low temperature not causing damage to the active layer comprising nitride semiconductor containing In.

13 Claims, 8 Drawing Sheets

U.S. PATENT DOCUMENTS

| | | |
|---|---|---|
| 6,177,057 B1 | 1/2001 | Purdy |
| 6,249,534 B1 | 6/2001 | Itoh et al. |
| 6,252,261 B1 | 6/2001 | Usui et al. |
| 6,372,041 B1 | 4/2002 | Cho et al. |
| 6,399,966 B1* | 6/2002 | Tsuda et al. ................ 257/103 |
| 6,423,984 B1* | 7/2002 | Kato et al. .................. 257/103 |
| 6,468,882 B1 | 10/2002 | Motoki et al. |
| 6,509,651 B1 | 1/2003 | Matsubara et al. |
| 6,586,762 B1* | 7/2003 | Kozaki ......................... 257/14 |
| 6,614,824 B1* | 9/2003 | Tsuda et al. ............. 372/46.01 |
| 6,677,619 B1* | 1/2004 | Senoh et al. .................. 257/94 |
| 6,711,191 B1* | 3/2004 | Kozaki et al. ........... 372/43.01 |
| 6,720,586 B1 | 4/2004 | Kidoguchi et al. |
| 6,858,882 B1* | 2/2005 | Tsuda et al. ................ 257/103 |
| 6,924,512 B1* | 8/2005 | Tsuda et al. .................. 257/97 |
| 2001/0008656 A1 | 7/2001 | Tischler et al. |
| 2001/0022154 A1 | 9/2001 | Cho et al. |
| 2002/0014631 A1 | 2/2002 | Iwata |
| 2002/0031153 A1 | 3/2002 | Niwa |
| 2002/0047113 A1 | 4/2002 | Ohno |
| 2002/0063258 A1 | 5/2002 | Motoki |
| 2002/0078881 A1 | 6/2002 | Cuomo |
| 2003/0143771 A1 | 7/2003 | Kidoguchi et al. |
| 2004/0031978 A1 | 2/2004 | D'Evelyn et al. |
| 2004/0139912 A1 | 7/2004 | Tomasz |
| 2004/0244680 A1 | 12/2004 | Dwilinski et al. |
| 2004/0255840 A1 | 12/2004 | Dwilinski et al. |

FOREIGN PATENT DOCUMENTS

| | | |
|---|---|---|
| EP | 0 716 457 A2 | 6/1996 |
| EP | 0 949 731 A2 | 10/1999 |
| EP | 0973207 A2 | 1/2000 |
| EP | 1088914 A1 | 4/2001 |
| FR | 2 796 657 | 1/2001 |
| GB | 2 326 160 | 12/1998 |
| GB | 2 333 521 | 7/1999 |
| JP | 2-137287 | 5/1990 |
| JP | 07-022692 B2 | 3/1995 |
| JP | 7-165498 | 6/1995 |
| JP | 7-249830 | 9/1995 |
| JP | 8-250802 | 9/1996 |
| JP | 9-134878 | 5/1997 |
| JP | 10-7496 | 1/1998 |
| JP | 10-70079 | 3/1998 |
| JP | 10-70338 | 3/1998 |
| JP | 11-54847 | 2/1999 |
| JP | 11-307813 | 11/1999 |
| JP | 2000-82863 | 3/2000 |
| JP | 2000-216494 | 8/2000 |
| JP | 2001-342100 | 12/2001 |
| JP | 2003040699 A | 2/2003 |
| JP | 2004168656 A | 6/2004 |
| WO | WO 98/55671 | 12/1998 |
| WO | WO 01/24284 | 4/2001 |
| WO | WO 01/24921 A1 | 4/2001 |
| WO | WO-02101120 A2 | 12/2002 |

OTHER PUBLICATIONS

Hisanori Yamane, Polarity of GaN Single Crystals Prepared with Na Flux, pp. 3436-3440.

Masichi Yano et al., Control of Nucleation Site and Growth Orientation of Bulk GaN Crystals.

R. Dwilinski et al., AMMO method of BN, AlN and GaN synthesis and crystal growth, pp. 1-4.

K. Pakula et al., Growth Of GaN Metalorganic Chemical Vapour Deposition Layers On GaN Single Crystals, vol. 88 (1995), pp. 861-864.

R. Dwilinski et al., On GaN Crystallization By Ammonothermal Method, vol. 90 1996, pp. 763-766.

R. Dwilinski et al., Exciton plhoto-liminescence of GaN bulk crystals grown by the AMMONO method, (1997), pp. 46-49.

Douglas R. Ketchum et al., Crystal growth of gallium nitride in supercritical ammonia, (2001) pp. 431-434.

Yu Melnik et al., Properties of free-standing gan bulk crystals grown by hvpe, 1998, pp. 269-274.

C.M. Balkas et al., Growth Of Bulk AlN And GaN Single Crystals By Sublimation, vol. 449 1997, pp. 41-46.

Sylwester Porowski, Bulk and homoepitaxial GaN-growth and characterisation, 1998, pp. 153-158.

Masato Aoki et al. Growth of GaN single crystals from a Na-Ga melt at 750 degreesC and 5Mpa of N2, 2000, pp. 7-12.

*Preliminary Notice of Rejection of the IPO* (Translation), 3 pages.

Journal of Physics Condensed Matter, v13, n32, Aug. 13, 2001, pp. 6875-6892.

Physica Status Solidi (a) Applied Research, vl80, nl, 2000, pp. 51-58.

M. Palczewska et al. (1998). "Paramagnetic Defects in GaN," MRS Internet J. Nitride Semicond. Res. 3, 45.

Preliminary Notice of Rejection of the IPO (Translation).

Form PCT/ISA/210.

Form PCT/IB/338.

Form PCT/IPEA/409.

Mao et al., "New Concept Technology Pressure-Variation Liquid Phase Epitaxy", SPIE Photonics Taiwan Conference Proceeding, Jul. 2000, pp. 1-12.

Shin-ichi Hirano et al. (1989) "Hydrothermal Synthesis of Gallium Orthophosphate Crystals, " Bull. Chem. Soc. Jpn. 62, pp. 275-278.

(1997). "Single Crystal Growth," Chapter 1 In Hydrothermal Synthesis Handbook. Gihodo Press, Second Edition, pp. 245-255.

R. A. Laudise (1991). "What is Materials Chemistry?" Chapter 27 In Materials for NonLinear Optics: Chemical Perspectives. American Chemical Society. pp. 410-433.

Noboru Sakagami et al. (1974) "Growth Kinetics and Morphology of ZnO Single Crystal Grown under Hydrothermal Conditions," *Journal of the Ceramic Association* 82, pp. 405-413.

T. Sekiguchi et al. (2000) "Hydrothermal Growth of ZnO Single Crystals and their Optical Characterization," *Journal of Crystal Growth* 214/215, pp. 72-76.

K. Yanagisawa et al. (1996) "Hydrothermal Single Growth of Calcite in Ammonium Acetate Solution," *Journal of Crystal Growth* 163, pp. 285-294.

K. Yanagisawa et al. (2001) "Improvement of Quality of Hydrothermally Grown Calcite Single Crystals," *Journal of Crystal Growth* 229, pp. 440-444.

S. Hirano (1991) "Growth of Gallium Orhophosphate Single Crystals in Acidic Hydrothermal Solutions," *Journal of Materials Science* 24, pp. 2805-2808.

Notification from Japanese Patent Office dated Mar. 29, 2005 and Submission of Printed Publication.

Office Action mailed Apr. 20, 2005, directed to related U.S. Appl. No. 10/479,807.

Office Action mailed Aug. 2, 2005, directed to related U.S. Appl. No. 10/493,594.

International Search Report mailed Feb. 18, 2003, directed to corresponding international application.

Akito Kuramata et al. (1996) "Substrates for III-V Nitride Semiconductors," *Oyo Buturi* 65(9), pp. 936-940.

Akasaki, I. et al. (1991). "Growth and Properties of Single Crystalline GaN Films by Hydride Vapor Phase Epitaxy," *Crystal Properties and Preparation* 32-34:154-157.

Chu, T. L. et al. (1974). "Crystal Growth and Characterization of Gallium Nitride," *J. Electrochem. Soc.: Solid-State Science and Technology* 121-1:159-162.

Kaschner, A. et al. (1999). "Influence of Doping on the Lattice Dynamics of Gallium Nitride," *MRS Internet J. Nitride Semicond. Res.* 4S1, G3.57.

Kim, S. T. et al. (1998). "Preparation and Properties of Free-standing HVPE Grown GaN Substrates," *Journal of Crystal Growth* 194:37-42.

Kuroda, Naotaka et al. (1998). "Precise Control of Pn-junction Profiles for GaN-based LD Structures Using GaN Substrates with Low Dislocation Densities," *Journal of Crystal Growth* 189/190:551-555.

Motoki, Kensaku et al. (2001). "Preparation of Large Free-standing GaN Substrates by Hydride Vapor Phase Epitaxy Using GaAs as a Starting Substrate," *J. Appl. Phys.* 40:L140-L143.

* cited by examiner

NITRIDE SEMICONDUCTOR LASER DEVICE AND MANUFACTURING METHOD THEREOF

TECHNICAL FIELD

This invention relates to a nitride semiconductor laser device provided with an end face film of single crystal $Al_xGa_{1-x}N$ ($0 \leq x \leq 1$) covering an end face or faces of the resonator.

BACKGROUND ART

In the so-far used semiconductor laser devices made from GaAs based semiconductors, extension of the lifetime of a laser device is achieved due to formation of a window structure where a protective film is formed on end faces of a resonator in the laser device. Similarly, in a nitride semiconductor of a nitride semiconductor laser device, end faces of a resonator are obtained by means of RIE (Reactive Ion Etching) or cleavage, which makes energy gap of end faces narrow, resulting in absorption of light and heat generation on the end faces that leads to impairment of the lifetime in making high-output type, i.e. over 100 mW, lasers. Therefore, it has been suggested that the window structure in nitride semiconductor laser device should be obtained by way of forming a protective film with an AlGaInN semiconductor film (Japanese Patent Application No. 7-249830) and with a different film such as AlN etc. (Japanese Patent Application No. 2002-26442).

DISCLOSURE OF INVENTION (Problems to be Solved by the Invention)

According to the prior art, it is necessary to apply a temperature over 1000° C. so as to form the above protective film of single crystal by use of vapor phase growth. Such high temperature causes damage to the active layer containing In. When the protective film is formed at a temperature zone not causing damage to the active layer, the formed protective film is amorphous. When the amorphous protective film is used for a window structure in semiconductor laser device, it brings about diffusion of emitted light and a laser beam becomes non-homogenous, because the amorphous protective film is not single crystal. Moreover, as a result of coloring of amorphous, light absorption and heating on end faces will occur, which consequently leads to accelerated degradation of end faces.

The object of this invention is to provide a nitride semiconductor laser device provided with end faces which is covered by a film of single crystal $Al_xGa_{1-x}N$ ($0 \leq x \leq 1$) formed at a low temperature zone not causing damage to the active layer.

(Means for Solving the Problems)

According to the present invention, there is provided a nitride semiconductor laser device comprises an n-type nitride semiconductor layer or layers, a p-type nitride semiconductor layer or layers and a resonator, provided with an active layer comprising nitride semiconductor containing In therebetween, wherein the resonator is provided with a pair of opposed end faces, and at least one of the light emitting end faces of the resonator is covered with an end face film of single crystal $Al_xGa_{1-x}N$ ($0 \leq x \leq 1$) having larger band gap energy than that of the active layer and formed at a low temperature not causing damage to the active layer.

A desired temperature not causing damage to the active layer comprising nitride semiconductor containing In should be lower than a temperature at which the active layer comprising nitride semiconductor containing In is formed. The active layer comprising nitride semiconductor containing In is grown usually at 900° C. and that temperature or less does not cause damage to the active layer due to degradation etc. Therefore, the end face film should be grown at 900° C. or less, preferably 600° C. or less, more preferably 500° C. or less.

In nitride semiconductor laser devices according to this invention, a resonator provided with an active layer comprising nitride semiconductor containing In means an optical waveguide region which is commonly comprised of an active layer and an optical guide layer. According to this invention, at least one of the end faces of the resonator region should be covered with an end face film. The active layer should include a single quantum well or a multi quantum well structure, provided with at least one of the well layers: InGaN or InAlGaN.

The end face film according to this invention is comprised of single crystal $Al_xGa_{1-x}N$ ($0 \leq x \leq 1$). The mixture ratio of crystal should be determined in relation to the function of the end face film. Within the light emitting end face of the active layer the band gap energy becomes narrower due to etching or cleavage for forming the light emitting end face. The mixture ratio of crystal should be thus determined in such a way that the end face film could contribute to widening of the energy gap of the end face and disappearance of the light emitting absorption. Considering the crystalline property of the end face film, the Al ratio in the crystal is 0.3 or less, preferably 0.15 or less. In nitride semiconductor laser device according to this invention, the end face film has preferably a thickness of 50 angstrom or more. Moreover, to obtain the uniformity of the end face film, the thickness thereof should be 1 μm or less, more preferably 2000 angstrom or less.

According to the present invention, AMMONO method may be applied to form the single crystal $Al_xGa_{1-x}N$ ($0 \leq x \leq 1$) at a low temperature. Using of AMMONO method, under a supercritical condition of ammonia, the single crystal $Al_xGa_{1-x}N$ ($0 \leq x \leq 1$) layer can be grown on a predetermined seed face, i.e. an end face of the resonator in the laser device according to this invention, and the end face film of single crystal can be formed at a temperature 900° C. or less, preferably 600° C. or less, more preferably 500° C. or less. In the AMMONO method, the end face film can be usually influenced by the autoclave composition and can contain at least one element selected from the group consisting of Ni, Cr, Co, Ti, Fe, Al, Si and Mn. The AMMONO method is characterized in that the end face film includes at least one element, used as a mineralizer, from Group No. 1 (IUPAC. 1989) element, Li, K, Na or Cs. According to the present invention, light from the nitride semiconductor laser device can not be absorbed on the end face film, which leads no heat absorption on the light emitting end face and COD generation can be reduced in the nitride semiconductor laser device at the power output 100 mW or more.

The nitride semiconductor laser device can be formed on the substrate selected from the group consisting of GaN substrate, sapphire substrate, spinel substrate, ZnO substrate, SiC substrate, ELO growth substrate formed on the heterogeneous substrate, for example Sapphire substrate etc, in the lateral direction growth of GaN and a substrate provided with a nitride semiconductor having an irregular surface. ELO (Epitaxial-Lateral-Overgrowth) substrate utilizes the lateral direction growth of GaN and allows reducing the dislocation density. According to the present invention, GaN substrate is preferably applied to become grown $Al_xGa_{1-x}N$ ($0 \leq x \leq 1$) as an end face film in the supercritical ammonia. In case that the nitride semiconductor laser device provided with a heterogeneous substrate whose composition is different from that of the end face film, the GaN substrate prevent the heterogeneous substrate to be dissolved in the supercritical ammonia and recrystallized into the end face film semiconductor and to become the impurity during the formation of the end face film. The GaN substrate means GaN substrate grown by means of supercritical ammonia method and so on. Nitride semiconductor laser devices grown on the different substrate from that of nitride semiconductor has difficulty in cleavage during the device processes, because the heterogeneous substrates on which GaN is grown do not have a cleavage property. However, GaN substrate has a cleavage property and the end face can be obtained by cleavage which performs excellently at forming the mirror faces. Moreover, GaN substrate for homo-epitaxial growth can prevent a curving after the laser device is prepared. It leads to avoid occurrence of cracking. Moreover, laser devices are usually grown on C-plane of the GaN substrate, because the GaN substrate is obtained by means of VPE (Vapor Phase Epitaxy). Using AMMONO method, after GaN bulk single crystal having thickness of 2.5 cm or more is grown in the direction of C-axis in the supercritical ammonia, a resultant GaN substrate is cut so as to obtain a GaN substrate having 1 inch or more diameters and having an A-plane or M-plane as a main plane. A-plane and M-plane having non-polar do not give a polarization effect to the active layer. Moreover, the dislocation density thereof is $10^4/cm^2$ or less. Otherwise, GaN substrate having (000-1) main plane can be changed into the substrate having (0001) main plane (C-plane) by means of polarity conversion.

In case that the nitride semiconductor laser device is grown on C-plane of GaN substrate, the end film is formed on M-plane or A-plane so that the end film having non-polar can be obtained. When the nitride semiconductor laser device is grown on A-plane of GaN substrate formed in the supercritical ammonia, the active layer of the laser device is not influenced by the polarization effect. The light emitting face of the resonator is M-plane, on which the end face film is formed and cleavage is easily performed. In case that the nitride semiconductor laser device is grown on M-plane of GaN substrate formed in the supercritical ammonia, the active layer is not influenced by the polarization effect and A-plane end face film having non-polar can be obtained on the light emitting face of the resonator.

According to a second aspect of the present invention, there is provided a method for manufacturing a nitride semiconductor laser device which comprises an n-type nitride semiconductor layer or layers, a p-type nitride semiconductor layer or layers and a resonator, provided with an active layer comprising nitride semiconductor containing In therebetween, which comprises: (1) etching or cleaving the laser device so that a pair of the opposed end faces in the resonator are formed; and (2) covering at least light emitting end face of the opposed end faces in the resonator with a film of single crystal $Al_xGa_{1-x}N$ ($0 \leq x \leq 1$) formed at a low temperature not causing damage to the active layer, wherein the end face film of single crystal $Al_xGa_{1-x}N$ ($0 \leq x \leq 1$) can be obtained in the supercritical ammonia at a low temperature not causing damage to the active layer, and wherein the end face film is formed after at least an upper surface of the resonator p-type contact layer is covered with a mask having lower or same solubility in the supercritical ammonia than that of the end face film. The formation of the mask can prevent the dissolution of the resonator of the laser device at the corner between the upper surface of the p-type contact layer and the end face when the end face film of the nitride semiconductor laser device is formed in the supercritical ammonia having high solubility. The mask may be selected from the group consisting of SiO, SiN, AlN, Mo and W. In the supercritical ammonia these materials for mask are more stable than GaN and the dissolution of the contact surface covered with the mask material can be prevented. In a later process, i.e. a formation process of a ridge or ridges, the mask can be easily removed.

In the method of manufacturing the nitride semiconductor laser device, the end face film is grown in the supercritical ammonia at a temperature from 100° C. to 900° C. The active layer having the quantum well structure containing InGaN of the nitride semiconductor laser device could be degraded, in case that the layers in the nitride semiconductor laser device are grown on the active layer at a temperature over 900° C. According to this invention, the end face film can be grown at a temperature of 900° C. or less, preferably 600° C. or less.

BEST MODE FOR CARRYING OUT THE INVENTION

Further herein a detailed description of the embodiments of the present invention is provided.

Figure 1:
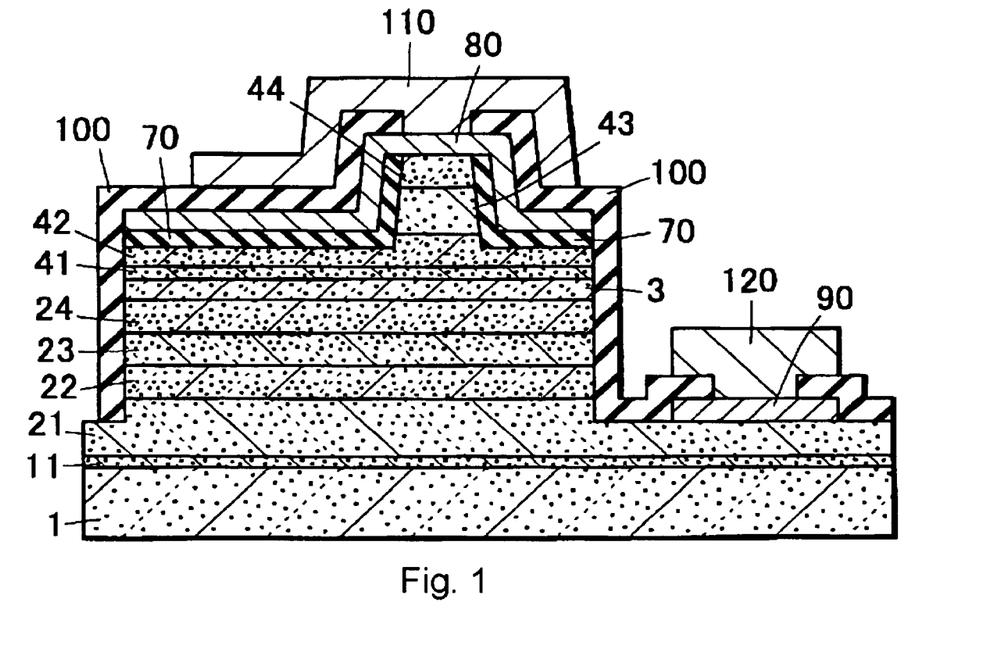
FIG. 1 is a schematic sectional view of the end face of the nitride semiconductor laser device according to the present invention.

The schematic sectional view of the semiconductor laser according to the present invention is shown in FIG. 1. On the sapphire substrate 1 the n-type nitride semiconductor layer or layers 2 and the p-type nitride semiconductor layer or layers 4 are deposited. Between them there is the active layer 3 of a single quantum well or a multi quantum well structure in the form of a nitride semiconductor containing In. This results in the laser device having the good light emitting efficiency at the wavelength region between near-ultraviolet and green visible light (from 370 nm to 550 nm). The n-type nitride semiconductor layer or layers 2 are composed of an n-type contact layer 21, a crack-preventing layer 22, an n-type clad layer 23 and an n-type optical guide layer 24. The crack-preventing layer 22 can be omitted when GaN substrate is used, because the wafer curving can be prevented. The p-type nitride semiconductor layer or layers 4 are composed of a cap layer 41, a p-type optical guide layer 42, a p-type clad layer 43 and a p-type contact layer 44. The n-type contact layer 21 can be formed on the sapphire substrate 1 through ELO layer for decreasing dislocation or AlGaN layer for decreasing the pits. In the above embodiment, the resonator of the semiconductor laser device is composed of the active layer 3, the p-type optical guide layer 24, n-type optical guide layer 42 and the cap layer 41. The light emitting end face of the resonator is covered with the end face film 5 of single crystal $Al_xGa_{1-x}N$ ($0 \leq x \leq 1$) If the light emitting face of the resonator is covered with the end face film (shown in FIG. 2), it is possible to reduce damage caused by reflected light.

Further herein the three typical manufacturing methods of the nitride semiconductor laser device of the present embodiment are provided.

FIG. 2A–D illustrates a manufacturing method of the end face film to cover a pair of end faces without mask.

FIG. 3A–E illustrates a manufacturing method of covering the resonator end face other than the light emitting end face with the mask and covering the light emitting end face with the end face film.

FIG. 5A–E illustrates the manufacturing method of the laser device which comprises the steps of forming the light emitting end face of the resonator on M-plane, forming the light emitting end face by cleavage after formation of a ridge and electrode, covering the resonator end face other than the light emitting end face with a mask, and covering the light emitting end face with M-place end face film and then forming laser device in the form of tip by cleavage etc.

The first method shown in FIG. 2, the wafer is prepared by growing the buffer layer 11 on the sapphire substrate 1 at a temperature of 700° C. or less, depositing successively the n-type nitride semiconductor layer or layers 2, the active layer 3 and the p-type nitride semiconductor layer or layers 4 on the buffer layer 11. (FIG. 2A) In this process, if the n-type nitride semiconductor layer or layers 2 are grown on the low temperature buffer layer 11 through ELO layer, the dislocation can be decreased.

Figure 2A:
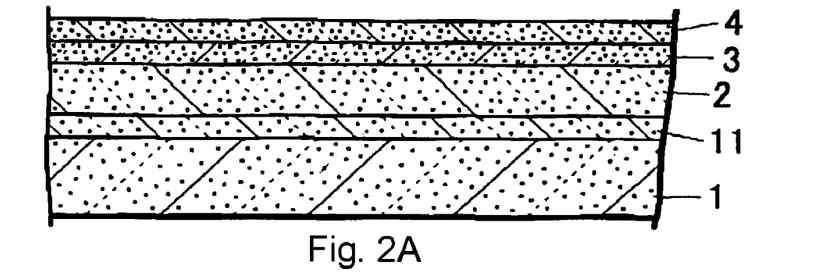
FIG. 2A–2D is a schematic sectional view illustrating a process for forming the end face film to cover a pair of end faces without mask.
Figure 2B:
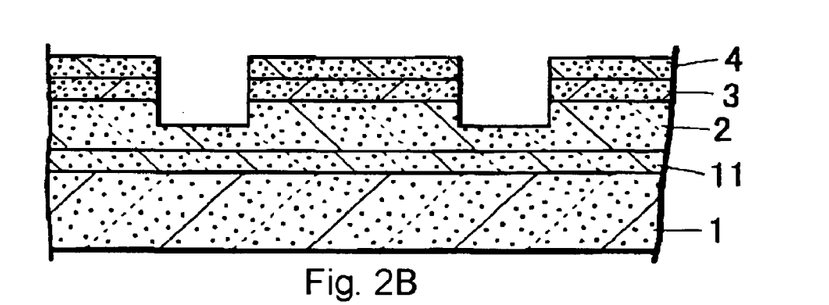

Next, the obtained wafer is subject to an etching process, as a result, the end face of the resonator and the n-type contact layer 21 are uncovered (FIG. 2B). Then the end face film 5 is formed, on the wafer whose end faces of the resonator are uncovered, by applying AMMONO method.

The wafer is placed in an autoclave together with the feedstock as a material for the end face film and with the mineralizer as a reaction accelerator. The autoclave is filled with ammonia and a temperature is controlled so as to make the ammonia into the supercritical condition inside the autoclave.

Figure 4:
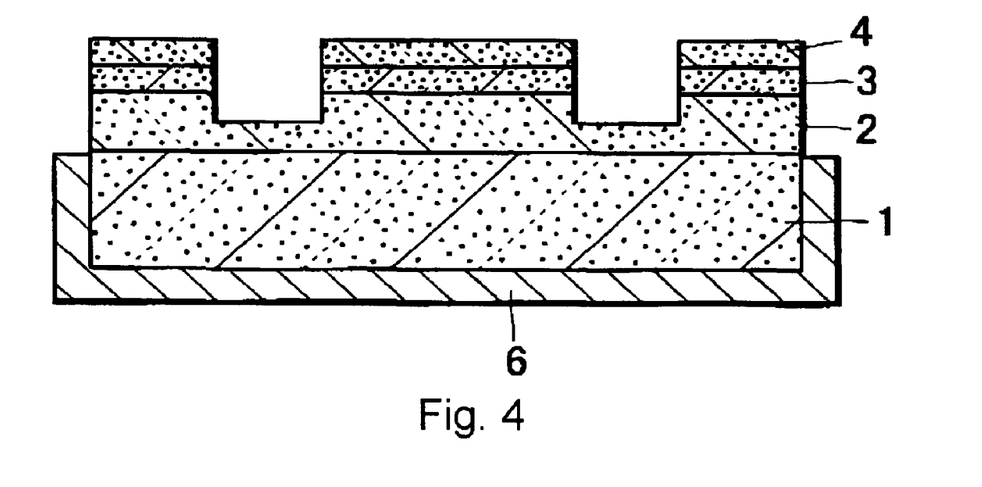
FIG. 4 is a schematic sectional view of the wafer provided with the substrate covered with a protective film, in case of the preferred embodiment applying the method of present invention.

The wafer successively deposited of the n-type nitride semiconductor layer or layers 2, the active layer 3 and the p-type nitride semiconductor layer or layers 4 on the sapphire substrate 1 is used as the wafer. Instead of that, such wafers can be used, for example, a) a wafer where a heterogeneous substrate such as a sapphire substrate is removed, b) a wafer successively deposited of the n-type nitride semiconductor layer or layers 2, the active layer 3 and the p-type nitride semiconductor layer or layers 4 on the sapphire substrate 1, wherein only the light reflecting end face of the resonator is covered with a masking 6 of the materials, i.e. Ag etc, which are not dissolved in a supercritical ammonia or are not mixed into the end face film in case of dissolution, c) a wafer where any other faces than light emitting end face are wholly covered with the masking 6 of Ag etc, d) a wafer wherein only the substrate is covered with the masking (FIG. 4).

The solubility of GaN is high in the supercritical ammonia. Therefore, it is necessary that the surface of the p-type nitride semiconductor layer or layers 4 should be covered with a mask, otherwise the nitride semiconductor device may be dissolved at the corner between the upper surface and the light emitting end face. For this, the p-type contact layer on the top surface of the p-type nitride semiconductor layer or layers 4 is covered with a mask. The mask material can be selected from the group consisting of SiO, SiN, AlN, Mo and W. In the supercritical ammonia these materials for mask are more stable than GaN and the dissolution of GaN can be prevented. It means that covering the p-type contact layer with a mask leads to restraint of the dissolution at the corner between the p-type contact layer and the light emitting end face. In the process after the formation of the end face film, the mask being easily removed is preferred. The thickness of the mask may be 1 μm or more.

Figure 2C:
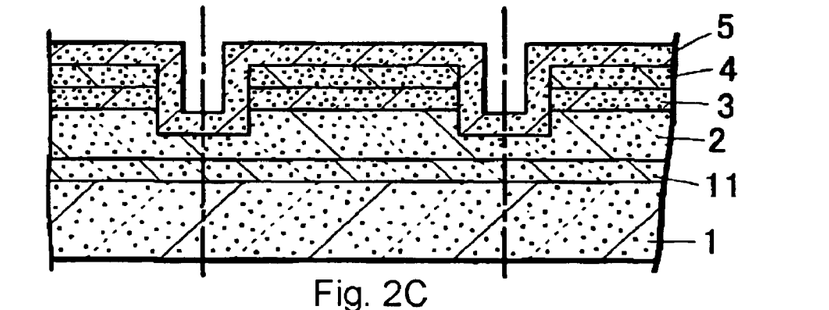
Figure 2D:
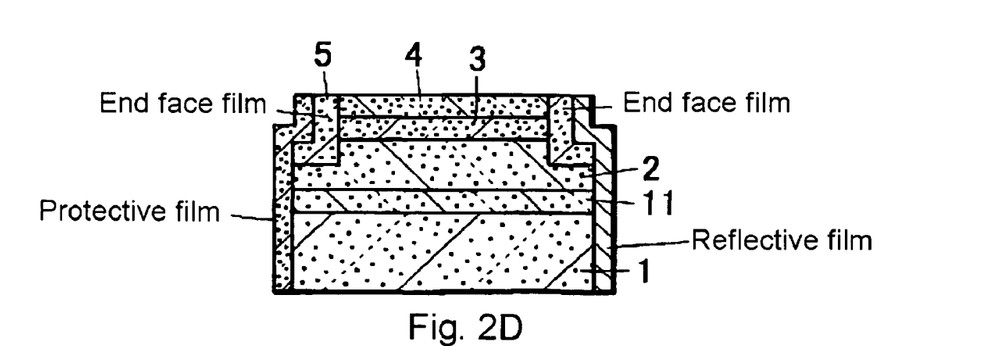

After the wafer is reacted in the autoclave, the obtained wafer is provided with the end face film of single crystal $Al_xGa_{1-x}N$ ($0 \leq x \leq 1$) at the uncovered surface of nitride semiconductor layer. (FIG. 2C)

In the next process, the laser device can be obtained by removing the end face film from the p-type semiconductor layer or layers 4, forming the protective film on the light emitting end face, forming the reflective film on another end face and cutting out from the groove portion. The protective film and the reflective film can be made of the same material, i.e. $SiO_2$, $TiO_2$ or plural films thereof, which have protective effect and reflective effect.

In the second method shown in FIG. 3, the wafer is prepared on C-plane of the GaN substrate 1 by successively depositing the n-type nitride semiconductor layer or the layers 2 composed of the n-type contact layer 21, the crack-preventing layer 22, the n-type clad layer 23 and the n-type optical guide layer 24, the active layer 3 and the p-type nitride semiconductor layer or layers 4 composed of the cap layer 41, the p-type optical guide layer 42, the p-type clad layer 43 and the p-type contact layer 44. (FIG. 3A) In this process, the GaN substrate allows decreasing the dislocation of the epitaxial layer, differently form the first method wherein n-type nitride semiconductor layer or layers 2 are grown on the low temperature buffer layer 11 through ELO layer.

Figure 3A:
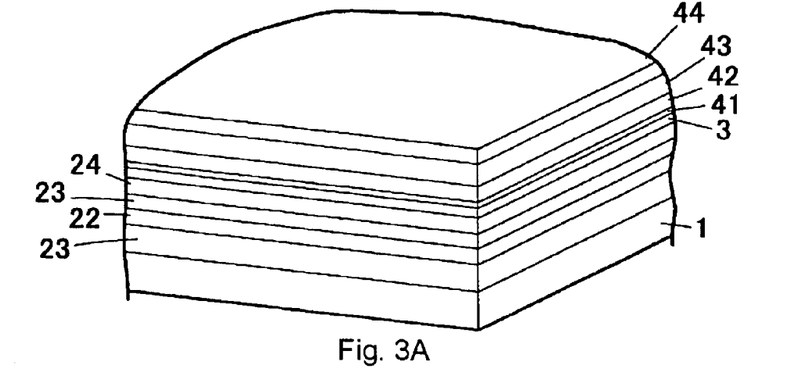
FIG. 3A–3E is a schematic sectional view illustrating a process of forming the end face film of the nitride semiconductor laser device, in case of the preferred embodiment according to the present invention.
Figure 3B:
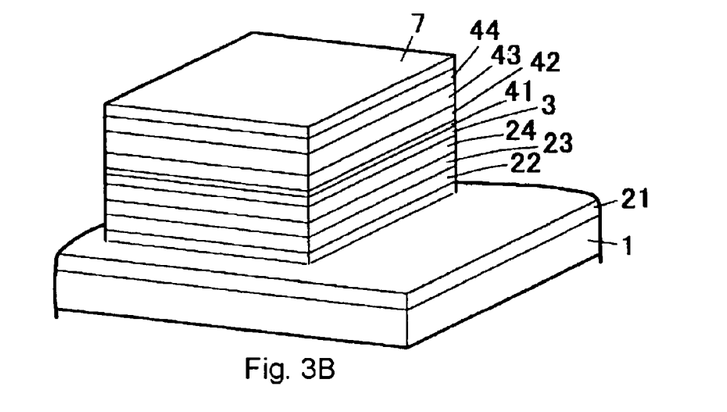
Figure 3C:
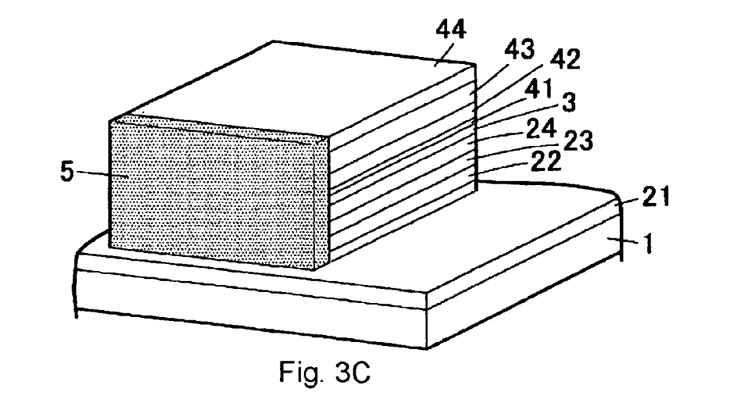
Figure 3D:
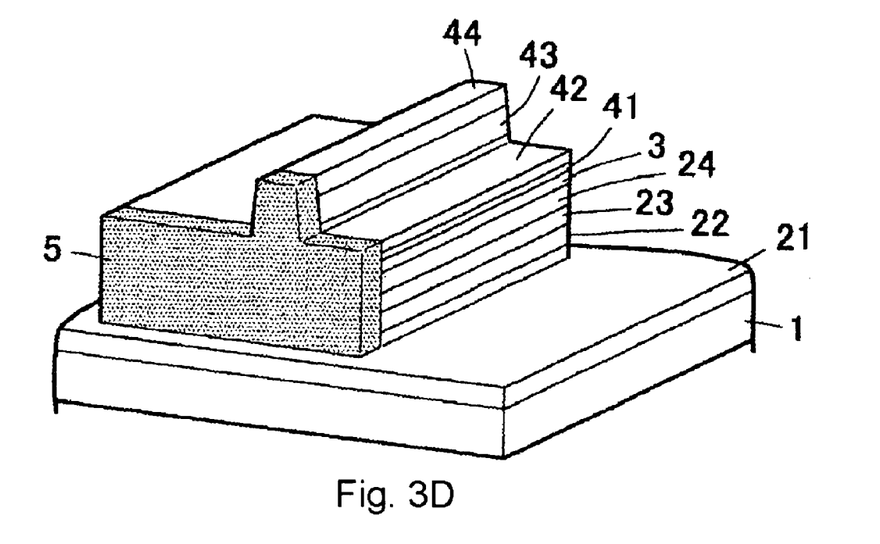

Next, the wafer is subject to an etching process so that the end faces of the resonator and n-type contact layer 21 are uncovered, and the resonator end face other than the light emitting end face is covered with the mask 7. (FIG. 3B) Then the wafer whose end faces of the resonator are uncovered is covered with the end face film 5 by applying AMMONO method. (FIG. 3C)

Next, a ridge is formed by a typical device process after the formation of the end face film and removing the mask 7. (FIG. 3D) The ridge stripe which performs the optical waveguide is formed in the direction of the resonator. The width of the ridge is from 1.0 μm to 20 μm and the ridge reaches p-type clad layer or p-type guide layer. Next, a buried layer 70 of $ZrO_2$ film is formed to cover the ridge. A p-type ohmic electrode 80 is formed to be in contact with the p-type contact layer 43 which is on the top surface of the ridge. Both of single ridge and plural ridges can be used. A multi-stripe-type laser device can be obtained by plural ridges.

Figure 3E:
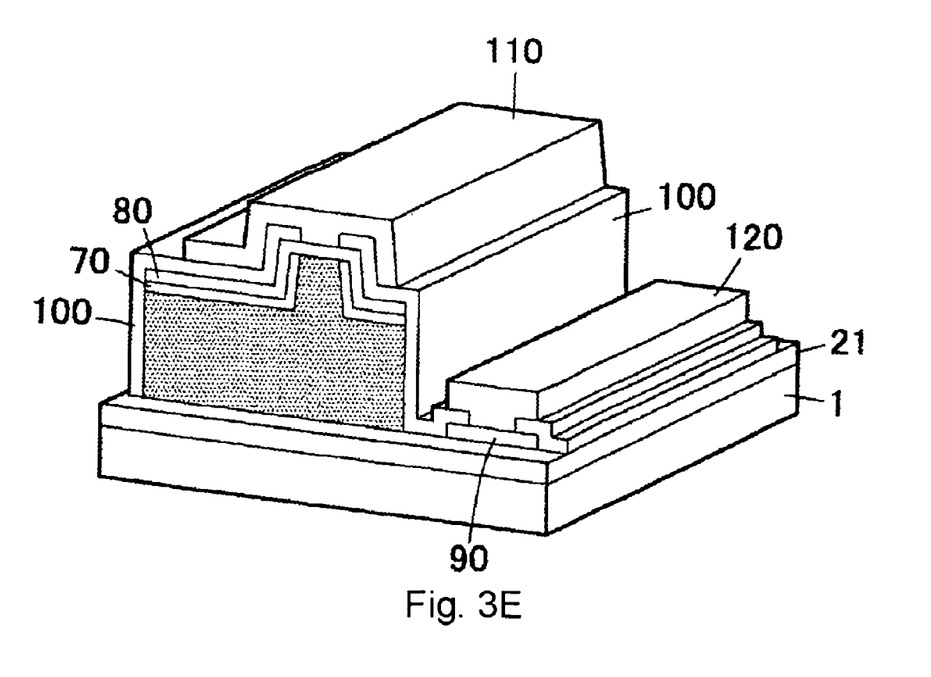

Next, an n-type electrode 90 arranged parallel to the p-type electrode is formed on the surface of the n-type contact layer 21. In further sequence, a p-type pad electrode 110 and an n-type pad electrode 120 are formed. Moreover, a $SiO_2/TiO_2$ insulating coating is formed to cover the entire device except for the surface of the p-type electrode and the n-type electrode, and due to an alternate arrangement and a patterning of the $SiO_2$ and $TiO_2$ layers it serves as the reflecting layer 100 at the moment of laser oscillation. Finally, each nitride semiconductor laser device is cut out from the wafer by scribing. In this way a finished nitride semiconductor laser device is obtained. (FIG. 3E, FIG. 1)

Moreover, the protective film can be formed on the end face film to perform an effective resonance. There is a difference of the reflective index between the protective film and the AlGaN end face film. Concretely, the protective film contains at least one element selected from the group consisting of Nb, Ni, Cr, Ti, Cu, Fe, Zr, Hf, W, Rh, Ru, Mg, Al, Sc, Y, Mo, Ta, Co, Pd, Ag, Au, Pt, Ga and the compound such as oxide, nitride and fluoride thereof.

Figure 5A:
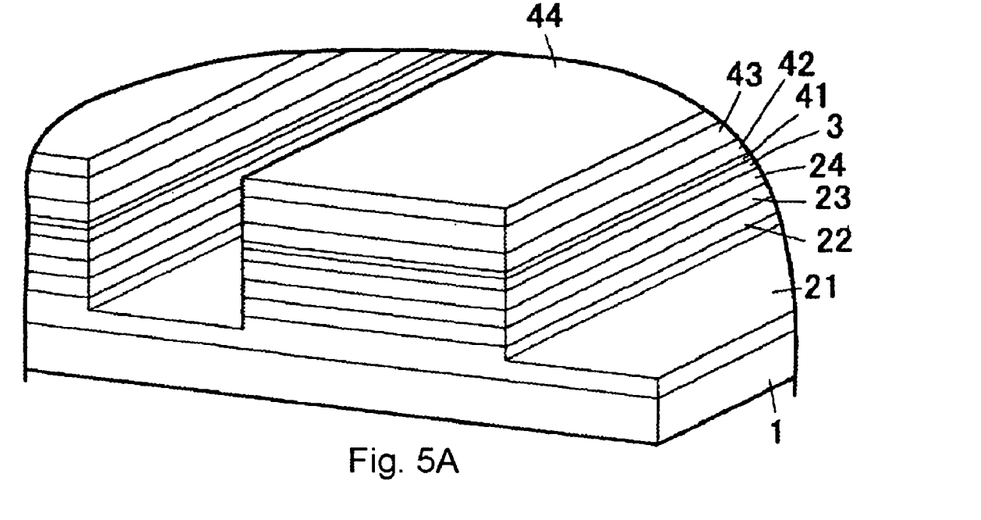
FIG. 5A–5E is illustrating a manufacturing method of the nitride semiconductor laser device by cleavage according to the present invention.
Figure 5B:
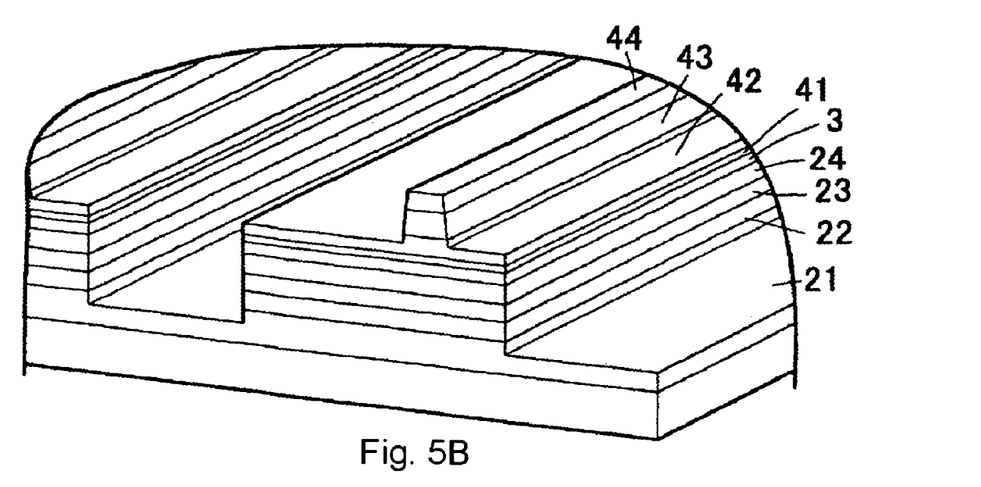
Figure 5C:
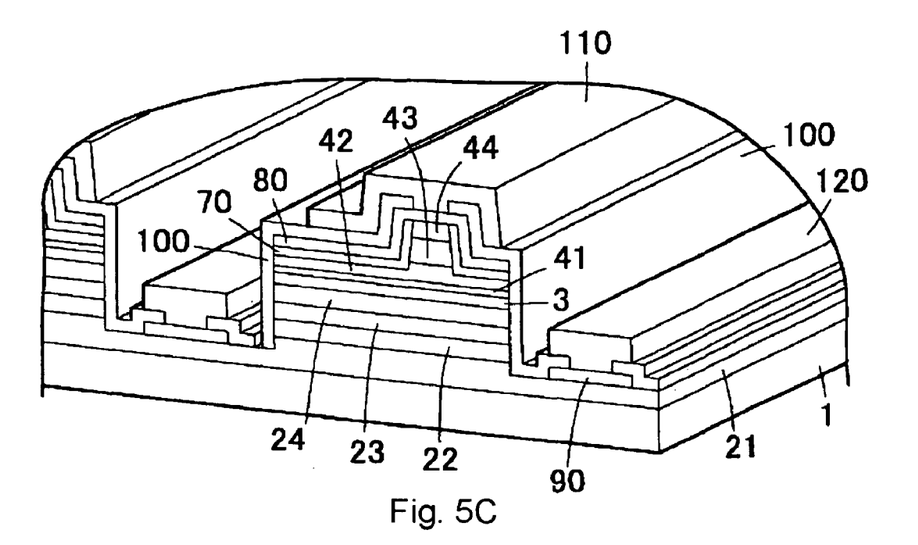
Figure 5D:
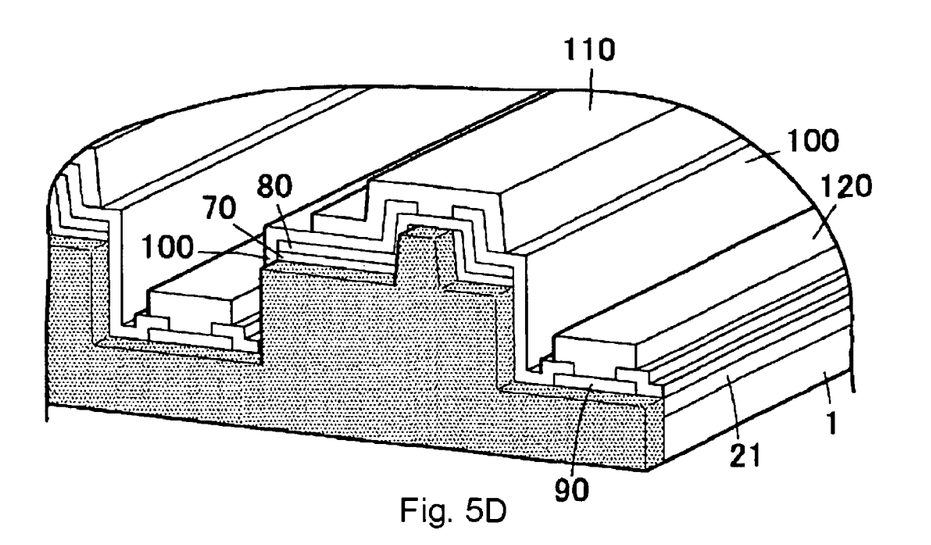
Figure 5E:
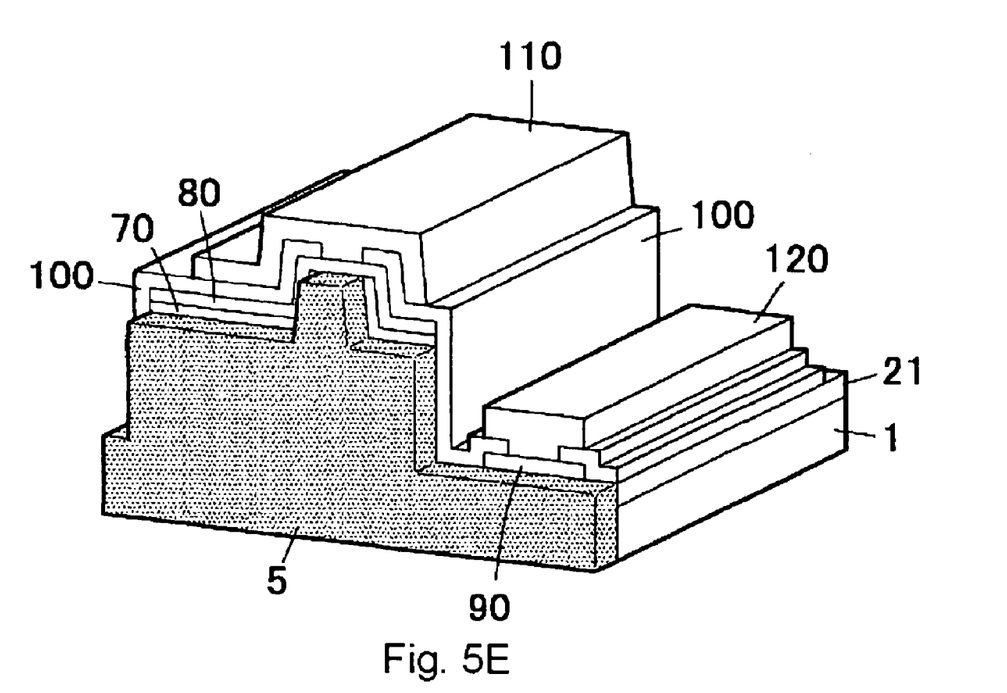

In the third method shown in FIG. 5A–E, A-plane of the GaN substrate 1 is used as a substrate and a light emitting end face is M-plane so that a laser device can be obtained by cleavage. A nitride semiconductor laser device is formed on the GaN substrate 1 similarly as the second method. The same reference numeral is given to the same element to omit the explanation. Next, the n-type contact layer 21 is uncovered by etching (FIG. 5A). Then a ridge is formed (FIG. 5B) and the p-type ohmic electrode 80 is formed to be in contact with the p-type contact layer 43 which is on the top surface of the ridge. Next, the n-type electrode 90 is formed on the surface of the n-type contact layer 21, and the p-type pad electrode 110 and the n-type pad electrode 120 are formed. (FIG. 5C) Next, the light emitting end face is formed by cleavage so that the wafer becomes in the form of a bar. Moreover, the end face film 5 is formed in a supercritical ammonia. (FIG. 5D) The resultant wafer is subject to cleavage so that a laser device can be obtained. (FIG. 5E)

In AMMONO method using supercritical ammonia, a nitride semiconductor is grown in a supercritical ammonia wherein a nitride gallium compound has the negative dissolution curve. Detailed explanation of the method is disclosed in Polish Patent Application Nos. P-347918, P-350375 and PCT Application No. PCT/IB02/04185. Those skilled in the art can easily carry out the present invention with reference to the abstract and examples explained below.

AMMONO method is summarized as follows. In the reaction system, the negative dissolution curve means that a solubility of the nitride semiconductor is low in the higher temperature zone and a solubility thereof is high in the lower temperature zone. When the temperature difference is controlled properly in the higher temperature zone and the lower temperature zone inside the autoclave, nitrides are dissolved in the lower temperature zone and nitrides are recrystallized in the higher temperature zone. Due to a generated convection flow from the lower temperature zone to the higher temperature zone, a predetermined concentration of nitrides can be kept in the higher temperature zone and the nitrides can be selectively grown on a seed.

The wafer is thus placed in the higher temperature zone, and the feedstock in the lower temperature zone of the reaction system inside the autoclave. Dissolution of the feedstock in the lower temperature zone leads to the oversaturation. In the reaction system, a convection flow is generated, due to which the dissolved feedstock is transported to the higher temperature zone. Due to a lower solubility at the higher temperature zone, the dissolved feedstock becomes recrystallized on the wafer which is a seed. Recrystallization approached in this way results in forming an end face film. Moreover, a characteristic feature of this method, as compared to the methods by which nitride semiconductor is formed from a vapor phase growth at a temperature over 900° C., is the fact that it allows growth of nitride semiconductor at a temperature of 900° C. or less, preferably 600° C. or less, and more preferably 500° C. or less. Due to this, in the wafer placed in the higher temperature zone a thermal degradation of the active layer containing In does not take place.

The material of the feedstock depends on the composition of the end face film. In case that the end face film of GaN is formed, GaN single crystal, GaN poly crystal, GaN precursor or metallic Ga can generally be used, wherein GaN single crystal or GaN poly crystal can be formed and then recrystallized. GaN formed by a vapor phase growth, such as HVPE method or MOCVD method, by AMMONO method, by flux method or by high pressure method can be used. The precursor of GaN can contain gallium azide, gallium imide, gallium amide or the mixture thereof.

Regarding AlN, similarly as GaN, AlN single crystal, or AlN poly crystal can be used. AlN precursor or metallic Al can also be used. In this case, AlN single crystal or AlN poly crystal can be formed and then recrystallized.

AlGaN is a mix crystal of AlN and GaN, and the feedstock thereof should be mixed appropriately. Moreover, the usage of metal and single crystal or poly crystal (for example, metallic Al and GaN single crystal or poly crystal) or the usage of more than two kinds of mineralizer etc. can lead to a predetermined composition.

It is possible to use alkali metals, such as Li, Na, K, Cs or compounds of alkali metals, such as alkali metal amide, alkali metal imide as a mineralizer. A molar ratio of the alkali metal to ammonia ranges from 1:200 to 1:2. Li is preferably used. Li is a mineralizer whose solubility is low, which leads to restraint of dissolution of the uncovered end face and effective formation of the thin end face film of the thickness from 50 angstrom to 1 μm.

The autoclave can typically be made of the alloy containing mainly Ni, Cr and Co, also such elements as Ti, Fe, Al, Si and Mn etc.

According to the present invention it is recommended that the thickness of the end face film 5 of single crystal $Al_xGa_{1-x}N$ be 50 angstroms or more. If the thickness thereof is less than 50 angstroms, the effect of smoothing of the etched surface will be lesser. On the other hand the top limit of the thickness may be set to a practical value which can be made. Moreover, according to the present invention, the end face film is formed preferably on the lateral surface and the end face of the stripe and also on the surface of the n-type contact layer 21, but it is recommended that overgrowth of the end face film on the surface of the n-type contact layer 21 should be kept at the level of 1 μm or less not to cover the active layer of the stripe.

To improve the smoothing effect of the end face film 5, it is recommended that the ratio of Al be lower. Nevertheless, according to the present invention, to improve the operation of the window structure, a small content of Al is desirable. Therefore Al content can be zero, and the end face film 5 should be composed of $Al_xGa_{1-x}N$ where preferably $0 \leq x \leq 0.3$, and more preferably $0 \leq x \leq 0.15$.

By forming the end face layer on the etched lateral stripe surfaces and the end face, it is possible to make the lateral stripe surfaces and the end face smooth mirror-like surfaces. In other words, just after being etched the stripe and the end face surfaces are relatively irregular and deposition of the end face film thereon, the end face film fills in irregularities and makes surfaces smooth. Moreover, the end face film can be a single film, but it can be also plural films composed of several layers varied in composition in Al content.

The following examples are intended to illustrate the present invention and should not be construed as being limiting.

EXAMPLE 1

First, a sapphire substrate 1 of 2 inch diameter on C-plane as a growth face is placed in a MOCVD reactor. Temperature is set at 510° C. Hydrogen is used as a carrier gas, and ammonia and TMG (thrimethylgallium) are used as gaseous materials. A GaN buffer layer 11 of 200 angstrom thickness is formed on the sapphire substrate, in the conditions of low-temperature growth.

On the buffer layer, the following layers are deposited one after the other:

(1) 4 μm thickness n-type GaN contact layer, doped with Si at the level of $3 \times 10^{18}/cm^3$.

(2) 1.5 μm thickness undoped $In_{0.06}Ga_{0.94}N$ crack-preventing layer.

(3) n-type clad layer, in the form of the superlattice of the total thickness being 1.2 μm, formed by alternate deposition of 25 angstroms thickness undoped $Al_{0.1}Ga_{0.9}N$ layers and n-type GaN layers doped with Si at the level of $1 \times 10^{19}/cm^3$.

(4) 0.2 μm thickness undoped n-type GaN optical guide layer.

(5) an active layer of the total thickness being 380 angstroms in the form of layers alternately arranged, i.e. barrier layer/well layer/barrier layer/well layer/barrier layer, wherein 100 angstroms thickness doped with Si $In_{0.05}Ga_{0.95}N$ layer forms a barrier layer, and 40 angstroms thickness undoped $In_{0.1}Ga_{0.9}N$ layer forms a quantum well layer.

(6) 300 angstroms thickness p-type $Al_{0.3}Ga_{0.7}N$ p-type cap layer, doped with Mg at the level of $1 \times 10^{20}/cm^3$.

(7) 0.2 μm thickness undoped GaN p-type optical guide layer.

(8) p-type clad layer in the form of the superlattice of the total thickness being 0.6 μm, formed by alternate deposition of 25 angstroms thickness undoped $Al_{0.16}Ga_{0.84}N$ layers and 25 angstroms thickness undoped GaN layers.

(9) 150 angstroms thickness p-type contact layer of p-type GaN doped with Mg at the level of $1 \times 10^{20}/cm^3$.

After the above layers are deposited, the formed wafer is subject to annealing in the MOCVD device under the nitrogen atmosphere, at a temperature of 700° C., which additionally reduces resistance of the p-type nitride semiconductor layer.

After annealing, the wafer is taken out from the reactor and a protective film (mask) in the form of $SiO_2$ stripe is deposited on the surface of the top p-type contact layer. Next, by using RIE method, the wafer is etched and stripe is formed, uncovering thereby end faces of the resonator and the surface of the n-type contact layer. The $SiO_2$ protective film (mask) formed on the surface of the p-type contact layer is removed by using the wet etching method.

Next, the wafer is introduced into the reactor (autoclave), which is filled with a supercritical ammonia. Having been filled with the feedstock in the form of GaN of 0.5 g, ammonia of 14.7 g and mineralizer in the form of Li of 0.036 g, the autoclave (36 cm³) is tightly closed at a temperature 500° C. or less inside the autoclave. The internal autoclave is divided into two zones: the higher temperature zone and the lower temperature zone. In the higher temperature zone of 550° C. there is a wafer, whereas in the lower temperature zone of 450° C. there are feedstock in the form of GaN and Ga metal. The sealed autoclave is left for three days.

Under the low temperature condition, in the supercritical ammonia 100 angstrom thickness single crystal GaN end face film is grown on the stripe end face, stripe lateral face and uncovered surfaces of the n-type contact layer and p-type contact layer.

After a single crystal GaN end face film is formed, the single crystal GaN formed on the surface of the top p-type contact layer is removed by etching. Next, the surface of the p-type contact layer is covered with the $SiO_2$ mask in the form of 1.5 μm wide strips and etching of the p-type clad layer is continued until ridge is formed on the strip part. Etching is carried out until thickness of the p-type clad layer becomes 0.1 μm on both sides of ridge.

In this way a ridge part of 1.5 μm width is formed.

Next, by use of the ion sputtering method, a 0.5 μm thickness $ZrO_2$ film is formed so that it would cover stripe surfaces over the $SiO_2$ mask.

After thermal processing, the buried layer 70 in the form of the $ZrO_2$ film is deposited on the top stripe surface, on lateral face of ridge and on the surface of the p-type clad layer located on both sides of ridge. This $ZrO_2$ film allows stabilizing a lateral mode at the moment of laser oscillation.

Next the p-type electrode 80 in the form of Ni/Au is formed on the p-type contact layer so that an ohmic contact would appear, and the n-type electrode 90 in the form of Ti/Al on the n-type contact layer. Then, the wafer is subject to thermal processing at a temperature of 600° C. Next, a pad electrode in the form of Ni(1000 Å)-Ti(1000 Å)-Au(8000 Å) are laid on the p-type and n-type electrode. After a reflecting film 100 in the form of $SiO_2$ and $TiO_2$ is formed, each nitride semiconductor laser device is cut out from the wafer by scribing.

Each nitride semiconductor laser device manufactured in this way is equipped with a heat sink and the laser oscillation is carried out. Due to an increase of a COD level, prolonged continuous oscillation time is expected—with threshold current density: 2.0 kA/cm², power output: 100 mW, preferably 200 mW, and 405 nm oscillation wavelength.

EXAMPLE 2

A single crystal GaN end face film of 1 μm thickness is grown on the only one light emitting end face on the stripe part, whereas other stages of production of nitride semiconductor laser device are carried out similarly as in Example 1.

Each laser device manufactured in this way is equipped with a heat sink and the laser oscillation is carried out. Prolonged laser lifetime in continuous oscillation mode is expected—with threshold current density: 2.0 kA/cm², power output: 100 mW and 405 nm oscillation wavelength—similar as in Example 1.

EXAMPLE 3

After the buffer layer is formed on a sapphire substrate, a 100 μm thickness GaN layer is deposited by the HVPE method. Next, as in Example 1, the n-type nitride semiconductor layer, the active layer and the p-type nitride semiconductor layer are formed. Then the sapphire substrate is removed and consequently a homogenous GaN substrate is obtained. In the other stages, as in Example 1, after the formation of an end face of the resonator, single crystal GaN of 100 Å thickness is formed on the end face film in the supercritical ammonia. Nitride semiconductor laser device thus obtained is expected to have the similar effect as in Example 1.

EXAMPLE 4

After the buffer layer is formed on a sapphire substrate, a 100 μm thickness GaN is deposited through ELO layer by HVPE method. Next, as in Example 1, the n-type nitride semiconductor layer, the active layer and the p-type nitride semiconductor layer are formed. Then the sapphire substrate is removed and consequently a nitride semiconductor laser device is obtained on a homogenous GaN substrate. By using the cleavage property of the homogenous GaN substrate, cleavage is carried out to obtain the growth face for the end face film. Next, the single crystal GaN of 1 μm thickness as an end face film is formed on the light emitting end face in the supercritical ammonia. In the other stages, as in Example 1, after the formation of an end face of a resonator, nitride semiconductor laser devices are formed. Nitride semiconductor laser device thus obtained is expected to have the similar effect as in Example 1.

EXAMPLE 5

The sapphire substrate is covered with Ag coating. In other respects, production of the nitride semiconductor laser device is carried out similarly as in Example 1.

EXAMPLE 6

A $SiO_2$ protective film in the form of lattice pattern is deposited on the surface of the top p-type contact layer. Next, etching of RIE method is carried out so as to uncover an end face of a resonator and the surface of the n-type contact layer. Under the condition of the $SiO_2$ mask of 0.5 μm thickness formed on the surface of the p-type contact layer, the wafer is introduced into the reactor (autoclave) inside which is filled with a supercritical ammonia. In other respects, production of the nitride semiconductor laser device is carried out similarly as in Example 1.

Laser device manufactured in this way is equipped with a heat sink and laser oscillation is carried out. Prolonged laser lifetime in continuous oscillation mode is expected—with threshold current density: 2.0 kA/cm$^2$, power output: 100 mW and 405 nm oscillation wavelength—similarly as in Example 1.

EXAMPLE 7

Single crystal GaN of 100 μm thickness is used as a substrate. The end face is uncovered by cleavage so as to form the end face of the resonator. Next, a mask in the form of $SiO_2$ is formed and end face film is grown. Other stages of production of nitride semiconductor laser device are carried out similarly as in Example 1.

Laser device manufactured in this way is equipped with a heat sink and laser oscillation is carried out. Prolonged laser lifetime in continuous oscillation mode is expected—with threshold current density: 2.0 kA/cm$^2$, power output: 100 mW and 405 nm oscillation wavelength—similarly as in Example 1.

INDUSTRIAL APPLICABILITY

A nitride semiconductor laser device comprises an n-type nitride semiconductor layer or layers, a p-type nitride semiconductor layer or layers and a resonator, provided with an active layer comprising nitride semiconductor containing In therebetween, wherein the resonator is provided with a pair of opposed end faces, and at least light emitting end face of the resonator is covered with an end face film of single crystal $Al_xGa_{1-x}N$ ($0 \leq x \leq 1$) formed at a low temperature not causing damage to the active layer. Due to this it is possible to extend the band gap energy in the area of the light emitting end face. This allows disappearance of the light emitting absorption on the end face and increasing the COD level. Owing to this invention it is possible to manufacture a high-output type, i.e. over 100 mW, nitride semiconductor laser device having high reliability and durability.

The invention claimed is:

1. A nitride semiconductor laser device which comprises an n-type nitride semiconductor layer or layers, a p-type nitride semiconductor layer or layers and a resonator, provided with an active layer comprising nitride semiconductor containing In therebetween,
    wherein said resonator is provided with a pair of opposed end faces, and at least light emitting end face of said resonator is covered with an end face film of single crystal $Al_xGa_{1-x}N$ ($0 \leq x \leq 1$) having larger band gap energy than that of the active layer and formed at a low temperature that does not cause damage to said active layer.

2. The nitride semiconductor laser device according to claim 1, wherein a thickness of said end face film is from 50 angstrom to 1 μm.

3. The nitride semiconductor laser device according to claim 1, wherein said end face of the resonator is covered with the end face film of a single crystal comprising $Al_xGa_{1-x}N$ ($0 \leq x \leq 1$) in a supercritical ammonia.

4. The nitride semiconductor laser device according to claim 3, wherein a p-type contact layer of said resonator is subject to at least masking and then said end face of said resonator is covered with the end face film of a single crystal comprising $Al_xGa_{1-x}N$ ($0 \leq x \leq 1$) in a supercritical ammonia.

5. The nitride semiconductor laser device according to claim 3, characterized in that said end face film includes at least one of the elements of Group I (IUPAC, 1989).

6. The nitride semiconductor laser device according to claim 1, wherein said active layer includes a quantum well structure comprising at least one InGaN well layer or InAlGaN well layer.

7. The nitride semiconductor laser device according to claim 1, wherein said nitride semiconductor laser device is formed on the substrate selected from the group consisting of a GaN substrate, a sapphire substrate, a spinel substrate, a ZnO substrate, a SiC substrate, a ELO growth substrate and a substrate provided with a nitride semiconductor having an irregular surface.

8. The nitride semiconductor laser device according to claim 1, wherein said nitride semiconductor laser device is formed on C-plane, A-plane or M-plane of GaN substrate.

9. The nitride semiconductor laser device according to claim 1, wherein said nitride semiconductor laser device is formed on C-plane of GaN substrate and said end face film is grown on M-plane or A-plane.

10. The nitride semiconductor laser device according to claim 1, wherein said nitride semiconductor laser device is formed on A-plane of GaN substrate, and the light emitting face of said resonator is M-plane, on which said end face film is formed.

11. The nitride semiconductor laser device according to claim 1, wherein said nitride semiconductor laser device is formed on M-plane of GaN substrate grown in supercritical ammonia, and the light emitting face of said resonator is A-plane, on which said end face film is formed.

12. A nitride semiconductor laser device which comprises an n-type nitride semiconductor layer or layers, a p-type nitride semiconductor layer or layers and a resonator, provided with an active layer comprising nitride semiconductor containing In therebetween, wherein said resonator is provided with a pair of opposed end faces, and at least light emitting end face of said resonator is covered with an end face film of single crystal $Al_xGa_{1-x}N$ (0<x<1) having larger band gap energy than that of the active layer and including at least one element from Group I (IUPAC, 1989), Li, K, Na or Cs which is formed at a low temperature that does not cause damage to said active layer.

13. The nitride semiconductor laser device according to claim 12, wherein said end face film of a single crystal comprising $Al_xGa_{1-x}N$ (0<x<1) is formed in supercritical ammonia.

* * * * *

UNITED STATES PATENT AND TRADEMARK OFFICE
CERTIFICATE OF CORRECTION

PATENT NO. : 7,057,211 B2 Page 1 of 1
APPLICATION NO. : 10/493746
DATED : June 6, 2006
INVENTOR(S) : Robert Dwilinski et al.

It is certified that error appears in the above-identified patent and that said Letters Patent is hereby corrected as shown below:

Title Page, Item (73) In the Assignee:
Please replace "AMMONO Sp. z o.o" with -- AMMONO Sp. z o.o. --

Signed and Sealed this

Thirtieth Day of March, 2010

David J. Kappos
*Director of the United States Patent and Trademark Office*